(12) United States Patent
Chen et al.

(10) Patent No.: US 10,157,892 B1
(45) Date of Patent: Dec. 18, 2018

(54) SEMICONDUCTOR PACKAGES AND METHODS OF FORMING THE SAME

(71) Applicant: Taiwan Semiconductor Manufacturing Co., Ltd., Hsinchu (TW)

(72) Inventors: Ying-Ju Chen, Yunlin County (TW); Hsien-Wei Chen, Hsinchu (TW); Wen-Chih Chiou, Miaoli County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/719,511

(22) Filed: Sep. 28, 2017

(51) Int. Cl.
| | |
|---|---|
| *H01L 23/544* | (2006.01) |
| *H01L 25/065* | (2006.01) |
| *H01L 23/00* | (2006.01) |
| *H01L 21/78* | (2006.01) |
| *H01L 25/00* | (2006.01) |

(52) U.S. Cl.
CPC .......... *H01L 25/0657* (2013.01); *H01L 21/78* (2013.01); *H01L 23/562* (2013.01); *H01L 25/50* (2013.01); *H01L 2225/06541* (2013.01)

(58) Field of Classification Search
CPC ..... H01L 25/50; H01L 25/0657; H01L 21/78; H01L 21/56; H01L 23/562
USPC ........................................................ 257/620
See application file for complete search history.

(56) References Cited

U.S. PATENT DOCUMENTS

| | | | |
|---|---|---|---|
| 7,906,836 B2 * | 3/2011 | Chen ....................... | H01L 21/78 257/675 |
| 8,749,027 B2 * | 6/2014 | Chen ...................... | H01L 23/481 257/620 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2017/0186732 A1 * | 6/2017 | Chu .................. | H01L 21/31111 |

* cited by examiner

*Primary Examiner* — Luan C Thai
(74) *Attorney, Agent, or Firm* — JCIPRNET

(57) ABSTRACT

Semiconductor packages and methods of forming the same are disclosed. The semiconductor package includes a plurality of chips, a first dielectric layer, a first redistribution structure, a second dielectric layer and a second redistribution structure. The first dielectric layer encapsulates the chips. The first redistribution structure is disposed over the plurality of chips and the first dielectric layer. The second dielectric layer surrounds the first dielectric layer. The second redistribution structure is disposed over the first redistribution structure, the first dielectric layer and the second dielectric layer.

20 Claims, 17 Drawing Sheets

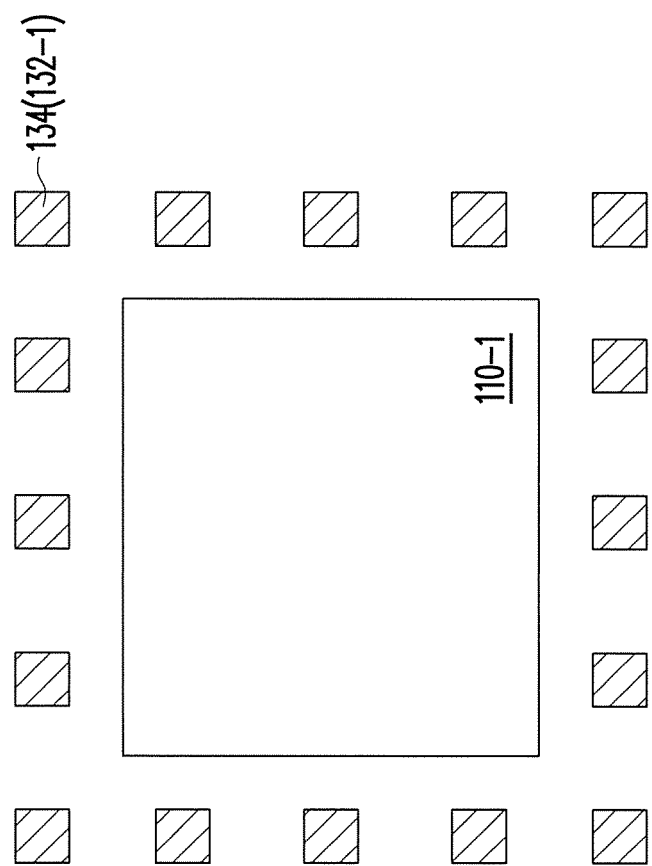

SEMICONDUCTOR PACKAGES AND METHODS OF FORMING THE SAME

BACKGROUND

The semiconductor industry continues to improve the integration density of various electronic components (e.g., transistors, diodes, resistors, capacitors, etc.) by continual reductions in minimum feature size. This allows more components to be integrated into a given area. In some applications, these smaller electronic components also require smaller packages that utilize less area than conventional packages.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. The 3DICs have, for example, decreased length of interconnects between the stacked dies, and thus provide improved integration density and other advantages, such as faster speeds and higher bandwidth. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 4 is a top view illustrating a seal ring in accordance with some embodiments of the disclosure.

DETAILED DESCRIPTION

Figure 1:
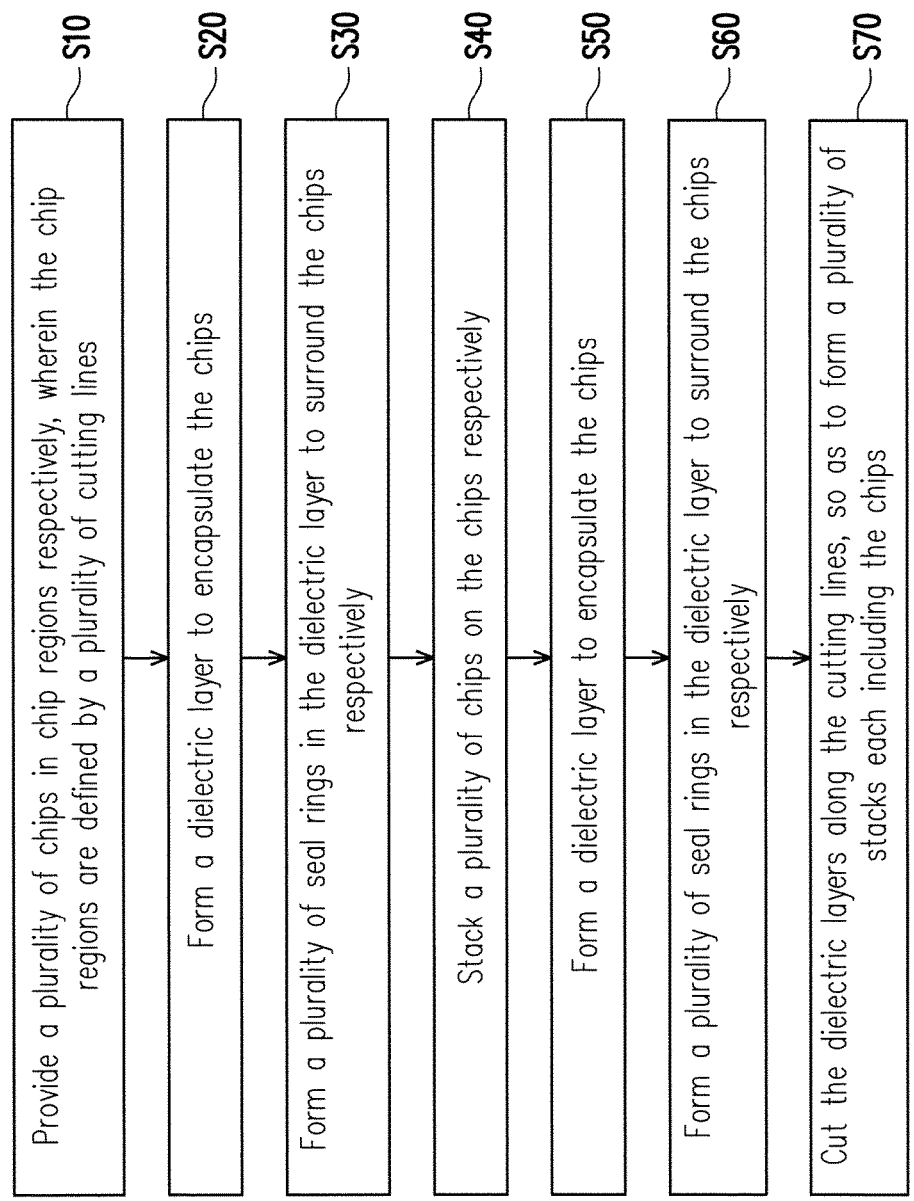
FIG. 1 is a flowchart showing a method of forming a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a flowchart showing a method of forming a semiconductor package in accordance with some embodiments of the disclosure. FIGS. 2A-2K are schematic cross-sectional views illustrating a method of forming a semiconductor package in accordance with some embodiments of the disclosure. In some embodiments, two or more chips or dies are shown to represent plural chips or dies, and one or more packages are shown to represent plural semiconductor packages obtained following the method.

Figure 2A:
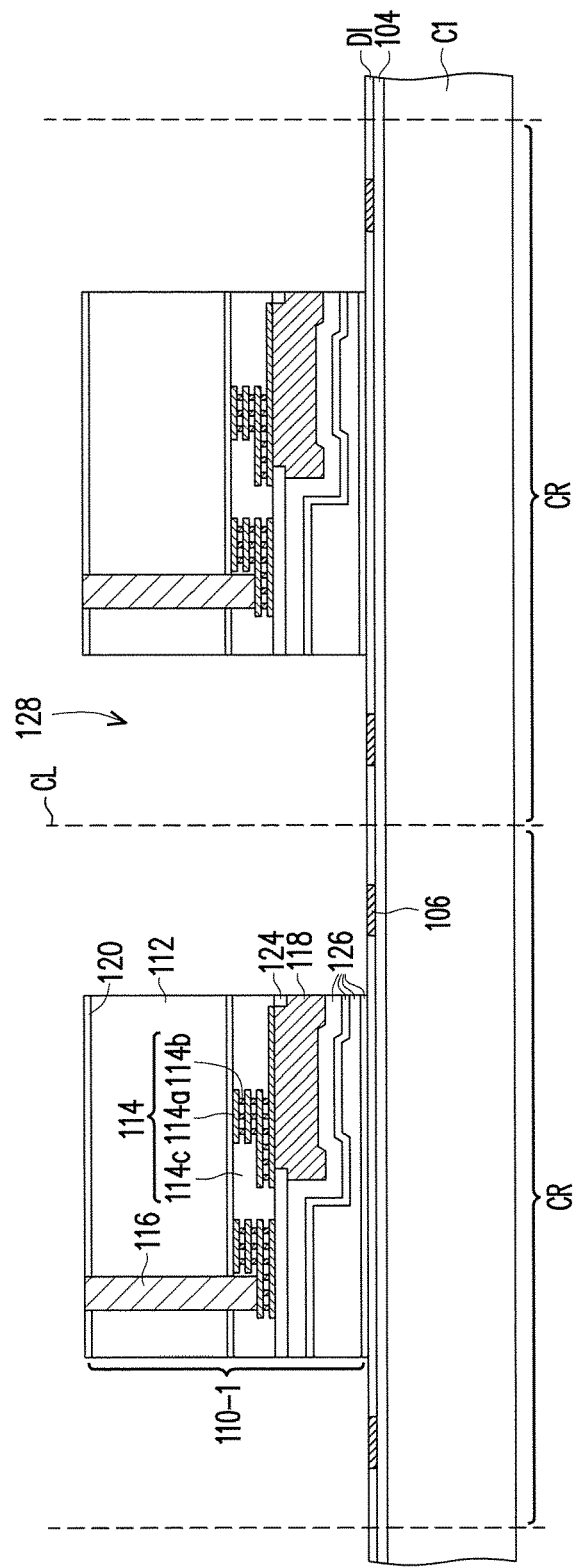
FIGS. 2A-2K are schematic cross-sectional views illustrating a method of forming a semiconductor package in accordance with some embodiments of the disclosure.

Referring to FIGS. 1 and 2A, in Step S10, a plurality of chips 110-1 is provided in chip regions CR respectively, and the chip regions CR are defined by a plurality of cutting lines CL. In some embodiments, an adhesive layer 104 and a dielectric layer DI are stacked over a carrier C1 in sequential order. The adhesive layer 104 is formed on the upper surface of the carrier C1, and the adhesive layer 104 is between the carrier C1 and the dielectric layer DI. The carrier C1 is, for example, a glass substrate. On the other hand, in some embodiments, the adhesive layer 104 is a ultra-violet (UV) glue, a light-to heat-conversion (LTHC) glue, or the like formed on the glass substrate. In some embodiments, the dielectric layer DI is, for example, polymer such as polyimide, benzocyclobutene (BCB), polybenzoxazole (PBO), or the like. In alternative embodiments, the dielectric layer DI may include non-organic dielectric materials such as silicon oxide, silicon nitride, silicon carbide, silicon oxynitride, or the like. In addition, in alternative embodiments, at least one dielectric layer is disposed between the adhesive layer 104 and the dielectric layer DI. In some embodiments, a plurality of alignment marks 106 is formed in the dielectric layer DI. A material of the alignment marks 106 is conductive material such as metal, for example.

Then, the chips 110-1 are mounted onto the dielectric layer DI over the carrier C1. The chips 110-1 are disposed in the chip regions CR respectively, and are arranged in an array including a plurality of rows and columns. A die attach film (DAF) (not illustrated) may be located between the chips 110-1 and the dielectric layer DI for adhering the chips 110-1 onto the dielectric layer DI. The chip 110-1 may be placed on the carrier C1 through a chip on wafer (CoW) process, for example. In some embodiments, the chip 100-1 maybe a logic die. The chip 110-1 may include a substrate 112, an interconnect structure 114, a through substrate via (TSV) 116, a pad 118 and an integrated circuit device (not shown). The substrate 112 may include an elementary semiconductor such as silicon or germanium and/or a compound semiconductor such as silicon germanium, silicon carbide, gallium arsenic, indium arsenide, gallium nitride or indium phosphide. The integrated circuit device is formed in and/or on the substrate 112. The integrated circuit device may be a transistor, and includes a gate structure, source/drain regions, and isolation structures, for example.

The interconnect structure 114 includes conductive lines 114a and vias 114b formed in dielectric layers 114c. The conductive lines 114a and the vias 114b may be formed of copper, copper alloys or other suitable conductive material. In some embodiments, the dielectric layers 114c include low-k dielectric materials. The dielectric constants (k values) of the low-k dielectric materials may be less than about 3.0 or about 2.5, for example.

In some embodiments, the TSV 116 is formed in the substrate 112, and extends from the front surface to the back surface of the substrate 112, that is, the TSV 116 penetrates the substrate 112. In addition, as shown in FIG. 2A, the TSV 20 extends into the dielectric layers 114c. In some embodiments, a portion of the TSV 116 is formed in an isolation layer 120. In some embodiments, the isolation layer 120 covers the TSV 116 before bonding to the carrier C1, and a portion of the isolation layer 120 is removed so as to decrease a total thickness of the chip 110-1 after bonding.

In some embodiments, the pad 118 is formed with portions in a passivation layer 124 and may be electrically coupled to the interconnect structure 114. The pad 118 may be an aluminum pad or an aluminum-copper pad, although other metallic materials may be used. In some embodiments, the pad 118 may be in physical contact with the topmost conductive lines (or pads) 114b with no vias therebetween. However, the disclosure is not limited thereto. In alternative embodiments, vias may be used to connect the topmost conductive lines 114b to the overlying pad 118.

In some embodiments, the pad 118 is covered by a passivation layer 126 over the dielectric layer 114c. The passivation layer 126 has a k value greater than 3.8 and is formed using a non-low-k dielectric material. The passivation layer 126 may be formed of un-doped silicate Glass (USG), silicon nitride, tetraethoxysilane (TEOS), or the like. In some embodiments, the passivation layer 126 is a composite layer, and the passivation layer 126 may include a desired number of the layers, for example, as shown in FIG. 2A, the passivation layer 126 includes four layers. However, the disclosure is not limited thereto. In alternative embodiments, the passivation layer 126 may be single layered.

Figure 2B:
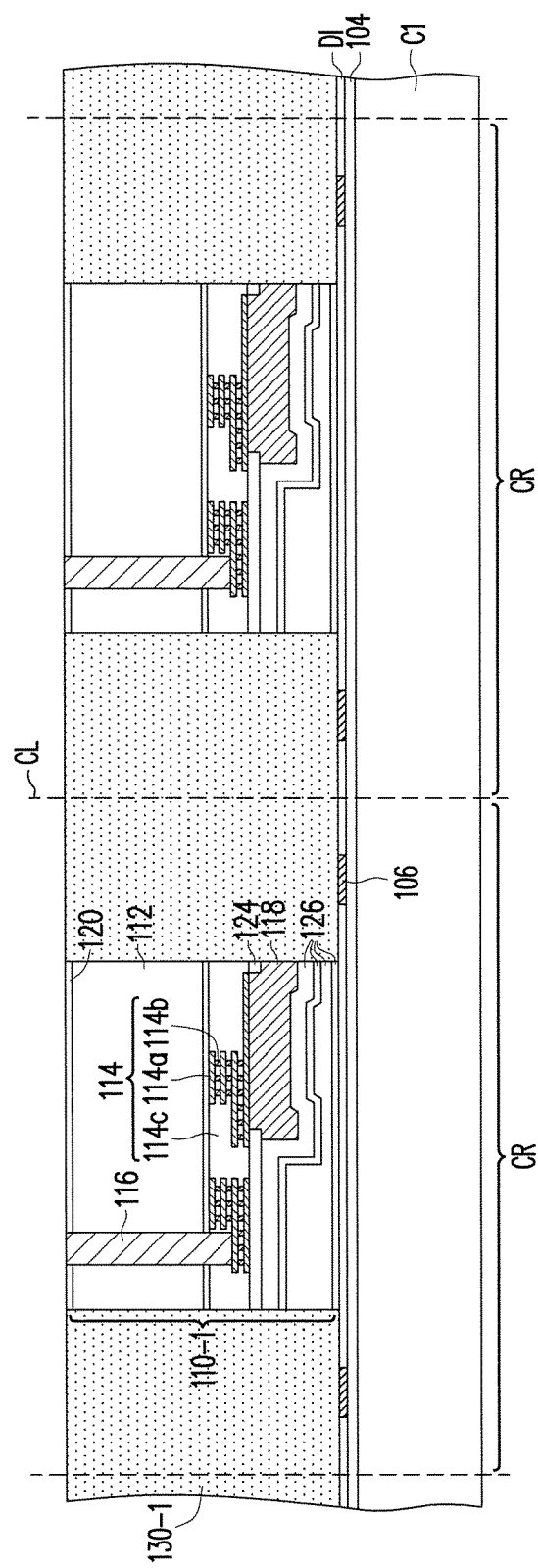

Referring to FIGS. 1 and 2B, in Step S20, a dielectric layer 130-1 is formed to encapsulate the chips 110-1. In some embodiments, the dielectric layer 130-1 is formed aside the chips 110-1 and filled in gaps 128 between the chips 110-1 on the dielectric layer DI, and top surfaces of the chips 110-1 are exposed. In some embodiments, top surfaces of the dielectric layer 130-1 is flush with the top surfaces of the chips 110-1. In some embodiments, the dielectric layer 130-1 may include epoxy resin, heat-resistant crystalline resin, polybenzoxazole, polyimide, phenylcyclobutene, polyphenylene sulfide, polyether ether ketone, polyether, a combination thereof, or the like. A method of forming the dielectric layer 130-1 may include a deposition process, a coating process or the like, and further include a planarization process.

Figure 2C:
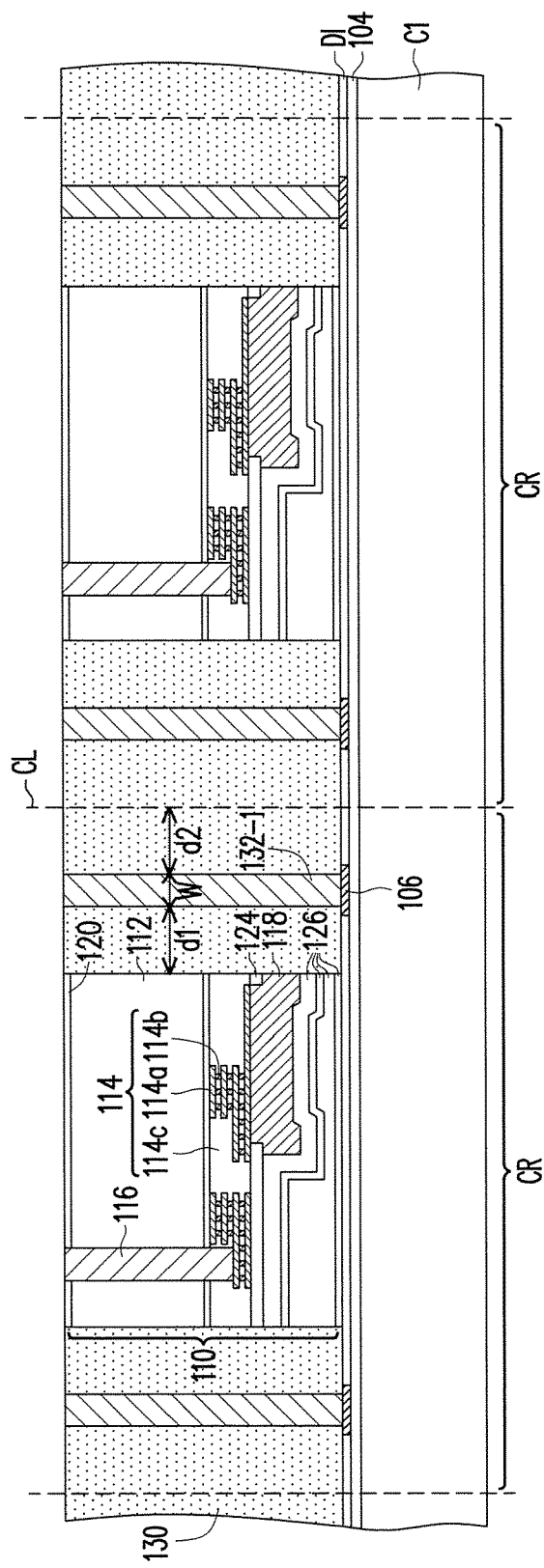
Figure 3:
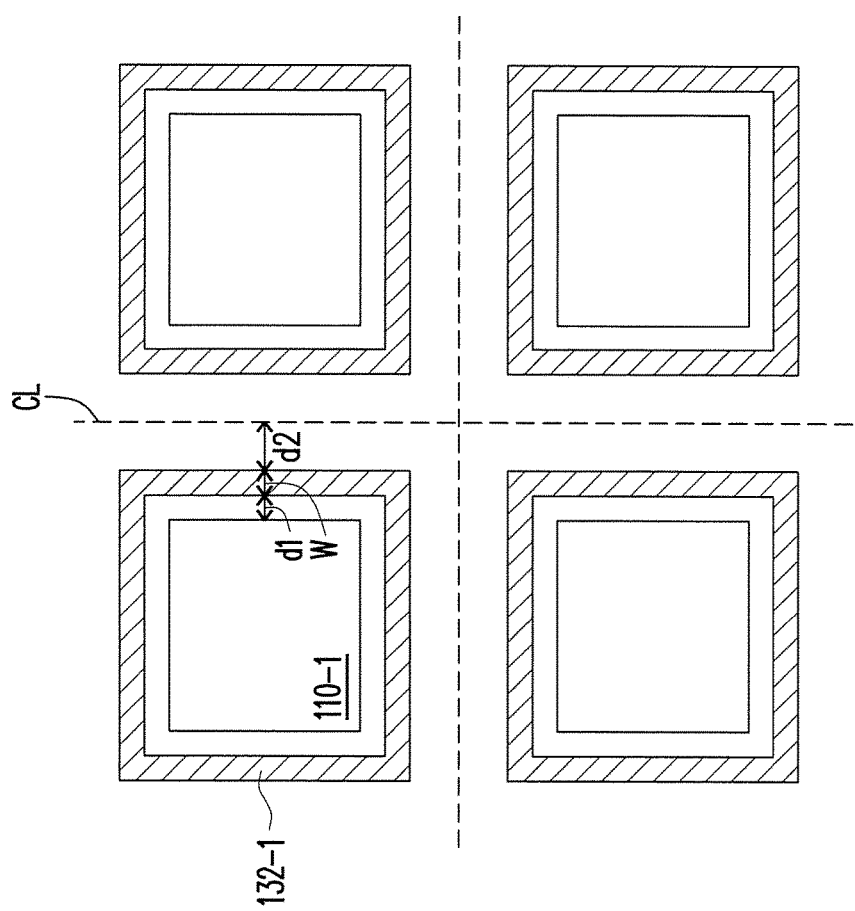
FIG. 3 is a top view illustrating a seal ring of FIG. 2C in accordance with some embodiments of the disclosure.
Figure 5A:
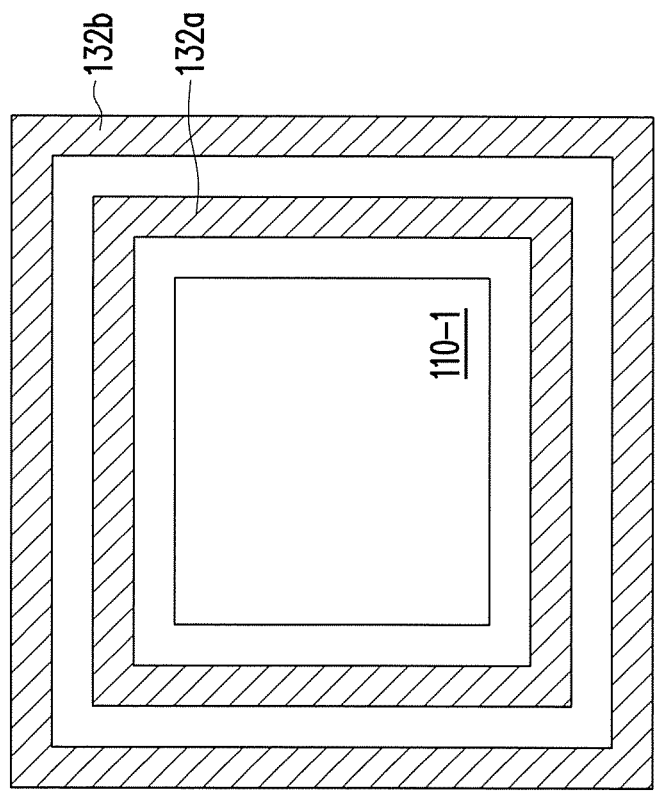
FIG. 5A is a top view illustrating a seal ring in accordance with some embodiments of the disclosure.
Figure 5B:
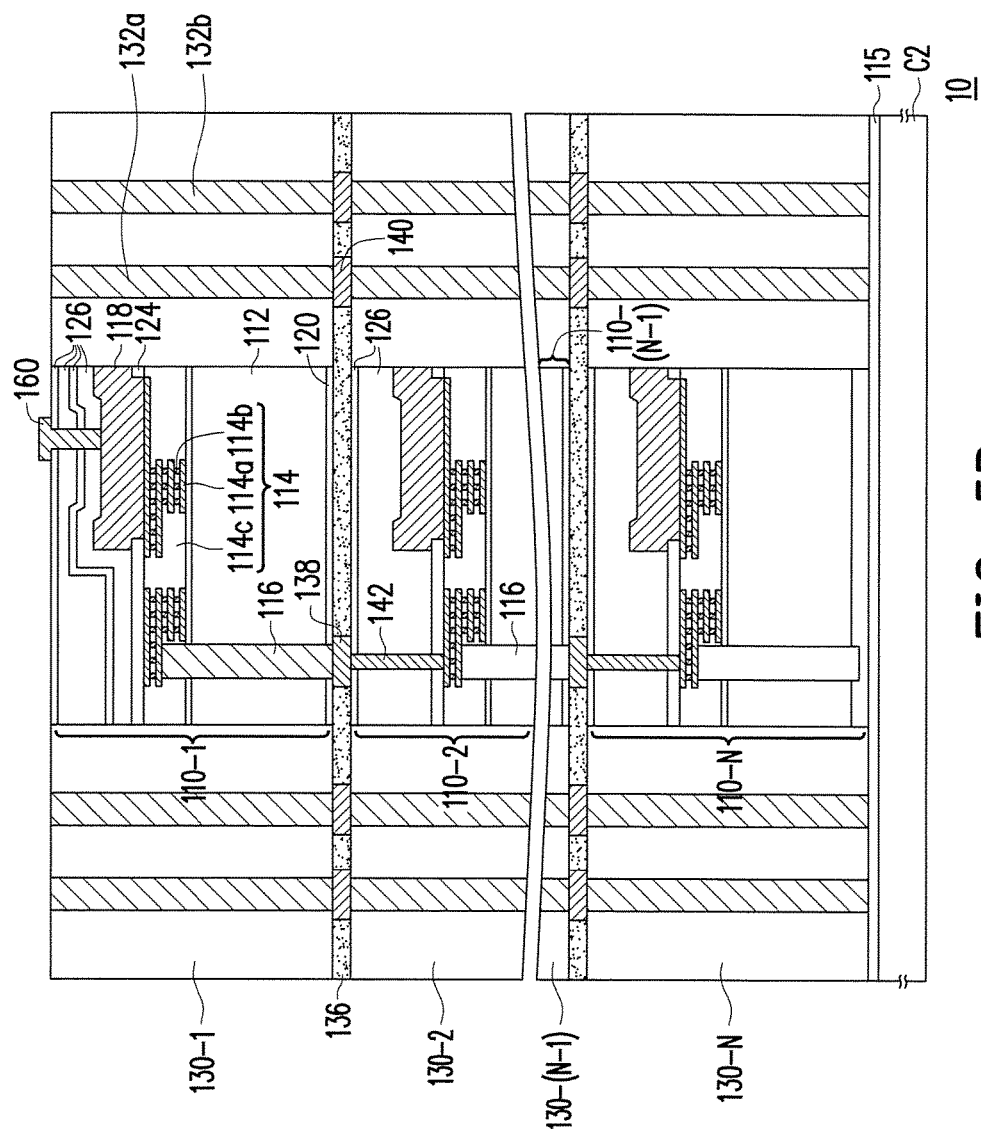
FIG. 5B is a schematic cross-sectional view of FIG. 5A.
Figure 6:
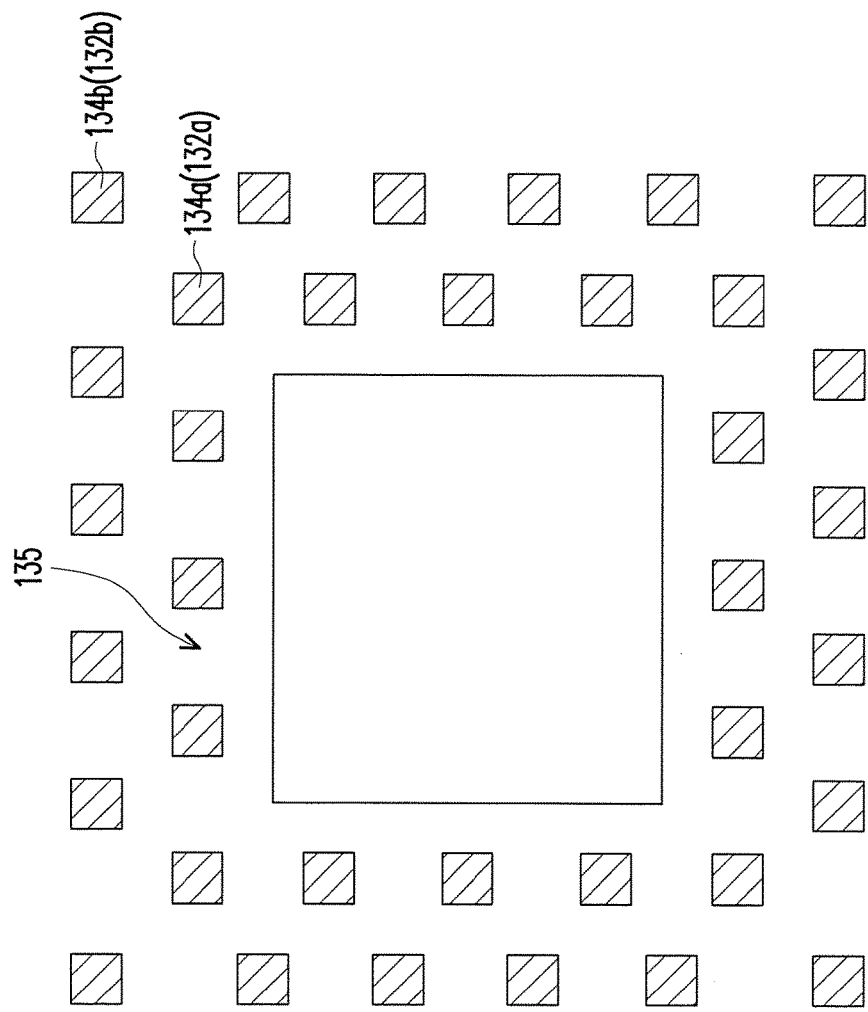
FIG. 6 is a top view illustrating a seal ring in accordance with some embodiments of the disclosure.

Referring to FIGS. 1 and 2C, in Step S30, a plurality of seal rings 132-1 is formed in the dielectric layer 130-1 to surround the chips 110-1 respectively. In some embodiments, the seal rings 132-1 are respectively formed between the cutting lines CL and the chips 110-1. The seal rings 132-1 may penetrate from a surface to an opposite surface of the dielectric layer 130-1. The seal rings 132-1 may be formed by forming openings in the dielectric layer 130-1 to expose a portion of the alignment marks 106 in the dielectric layer DI and filling materials in the openings. In some embodiments, the seal rings 132-1 are formed on the alignment marks 106, and the alignment marks 106 may serve as etching stop layers in the process of forming the openings in the dielectric layer 130-1, for example. The materials of the seal rings 132-1 may be conductive material such as copper, aluminum or alloys thereof. However, the disclosure is not limited thereto. In alternative embodiments, the material of the seal rings 132-1 may be non-conductive materials. A method of forming the seal rings 132-1 includes a plating process, a deposition process, or the like. A width W of the seal ring 132-1 is not smaller than 2 μm, a distance d1 from the seal ring 132-1 to the adjacent chip 110-1 is not smaller than 10 μm, and a distance d2 between the seal ring 132-1 to the adjacent cutting line CL is not smaller than 10 μm, for example. In some embodiments, as shown in FIG. 3, the seal ring 132-1 may be a continuous and enclosed pattern, which corresponds to an outline of the chip 110-1. In some embodiments, the seal ring 132-1 is a hollow rectangular, a hollow circle (not shown) or the like. For clarity, there are four chips 110-1 shown in FIG. 3. However, the disclosure is not limited thereto. In alternative embodiments, as shown in FIG. 4, the seal ring 132-1 may have a plurality of patterns 134, which are separated and arranged to surround the chip 110-1. In other words, the seal ring 132-1 is substantially a discontinuous and open pattern. In some embodiments, the patterns 134 of the seal ring 132-1 are arranged as a hollow rectangular, a hollow circle (not shown) or the like. The seal rings 132-1 may have the same or different shape, arrangements of the patterns, width or the like. In addition, as shown in FIGS. 5A and 5B, the chip 110-1 may be surrounded by at least two seal rings 132a, 132b. The seal ring 132a is disposed between the seal ring 132b and the chip 110-1. In alternative embodiments, as shown in FIG. 6, the seal rings 132a, 132b may have patterns 134a, 134b respectively. The patterns 134a and the patterns 134b may be alternatively disposed, which means the patterns 134b may be formed as aligning to a gap 135 between the patterns 134a. However, the disclosure is not limited thereto. In alternative embodiments, the patterns 134a and the patterns 134b may be aligned to one another. In alternative embodiments, at least one of the seal rings 132a, 132b may be an enclosed ring, for example. Although two seal rings are illustrated in FIG. 6, the number of the seal ring surrounding one chip 110-1 may be larger than 2, such as 3, 4, 5 and so on.

Figure 2D:
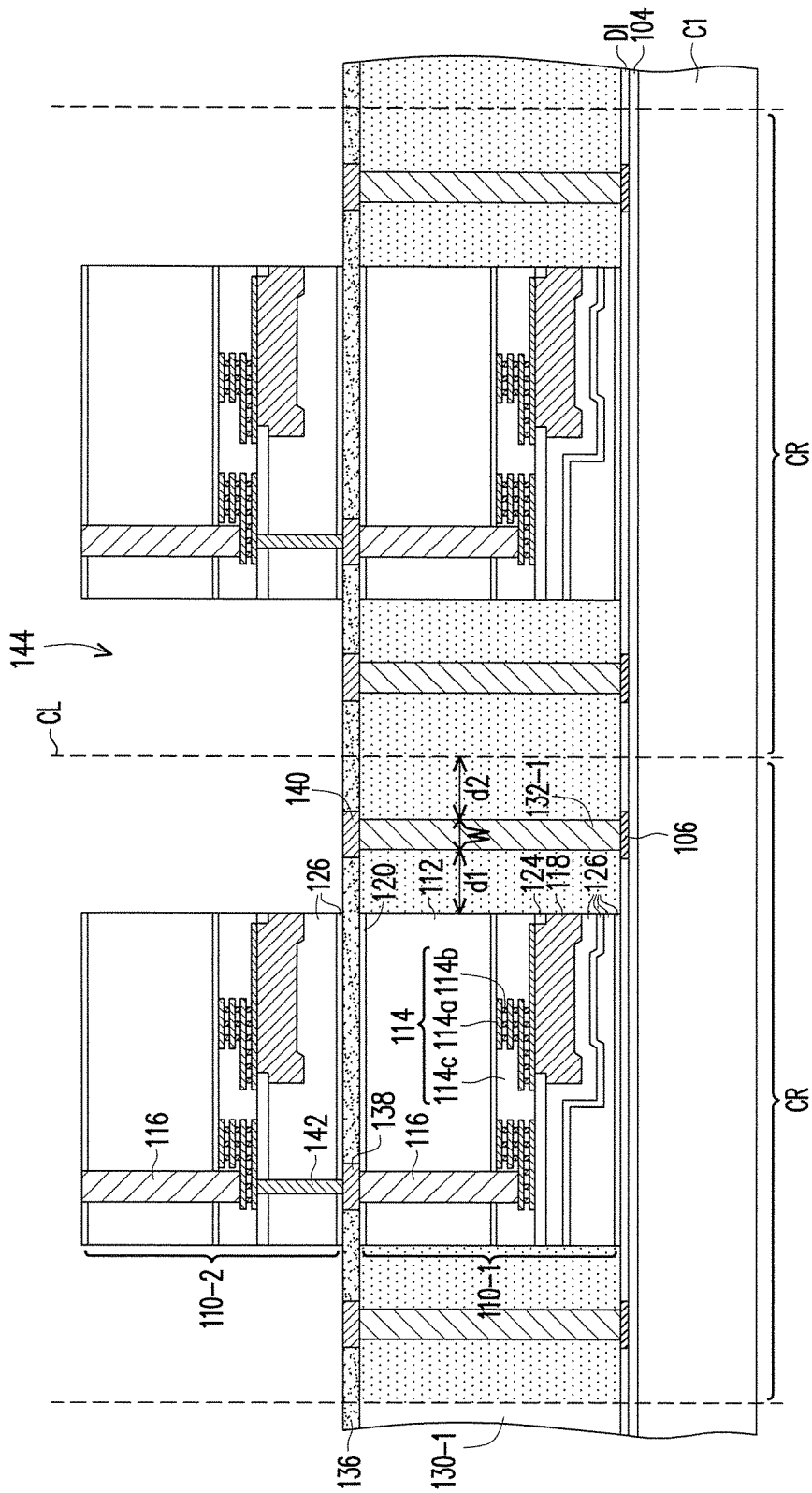

Referring to FIGS. 1 and 2D, in Step S40, after the seal rings 132-1 are formed, a plurality of chips 110-2 is stacked on the chips 110-1 respectively along a stacking direction. In some embodiments, the chips 110-2 are disposed on the chips 110-1 in the chip regions CR, and the stacking direction is a vertical direction, for example. The structure of the chip 110-2 is similar to the chip 110-1, except that the chip 110-2 may include a via 142 to electrically connect the TSV 116 of the chip 110-2 and the TSV 116 of the chip 110-1. Accordingly, the chip 110-1 and the chip 110-2 stacked on the chip 110-1 are electrically connected. In addition, the passivation layer 126 may include two layers, for example. In some embodiments, a dielectric layer 136 is formed over the chips 110-1 and the dielectric layer 130-1. That is, the dielectric layer 136 is formed between the chips 110-2 and the chips 110-1. In some embodiments, a connector 138 is formed in the dielectric layer 136 to electrically connect the via 142 of the chip 110-2 and the TSV 116 of the chip 110-1. In addition, an etch stop pattern 140 may be further formed in the dielectric layer 136 over the seal ring 132-1. In some embodiments, materials of the connector 138 and the etch stop pattern 140 may be metal or other suitable conductive material. In some embodiments, materials of the connector 138 and the etch stop pattern 140 may be the same, and the connector 138 and the etch stop pattern 140 may be formed simultaneously, for example. However, the disclosure is not limited thereto.

Figure 2E:
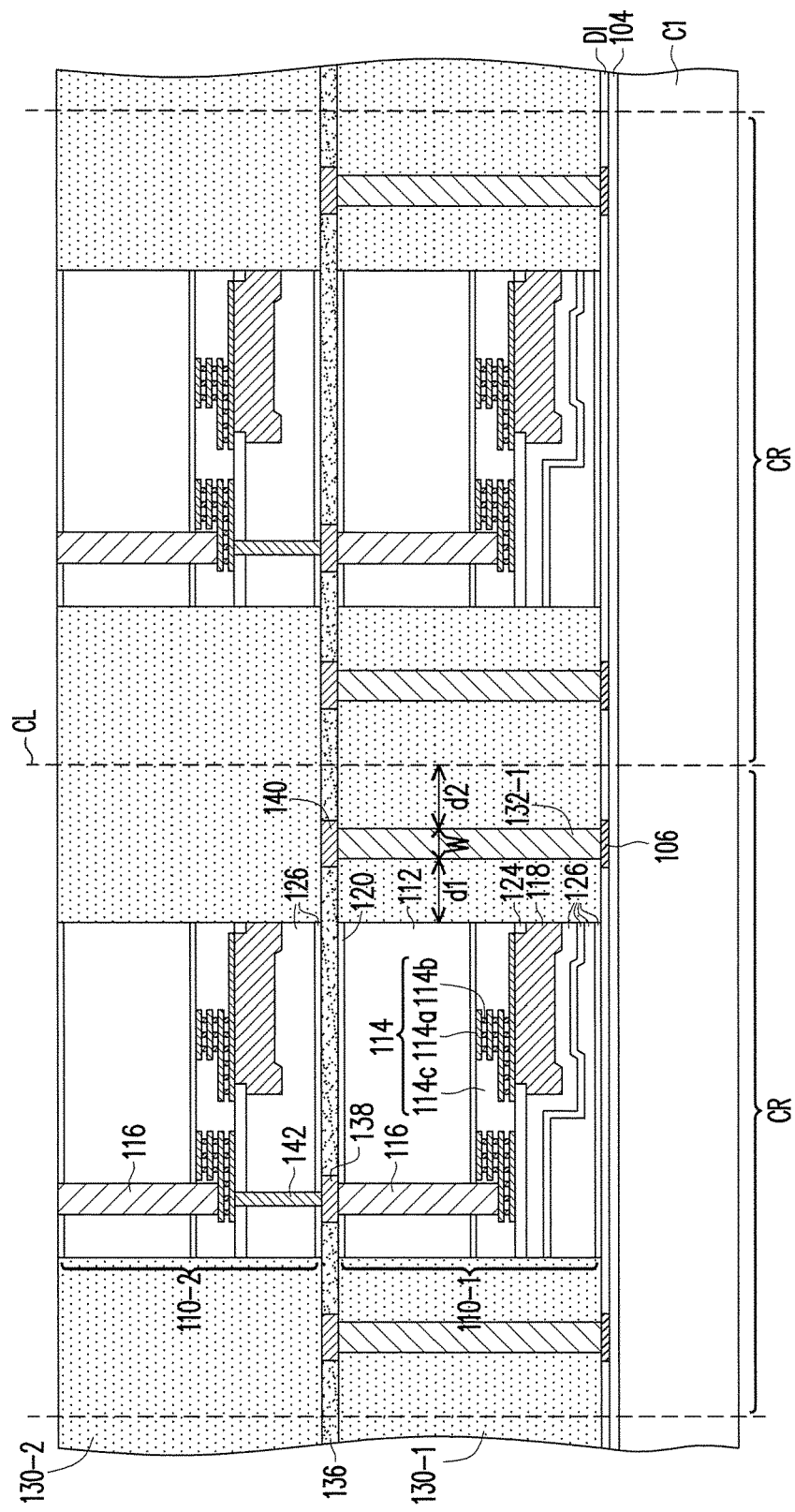

Referring to FIGS. 1 and 2E, in Step S50, a dielectric layer 130-2 is formed to encapsulate the chips 110-2. In some embodiments, the dielectric layer 130-2 is formed aside the chips 110-2 and filled in gaps 144 between the chips 110-2 over the dielectric layer 130-2, and top surfaces of the chips 110-2 are exposed. In some embodiments, top surfaces of the dielectric layer 130-2 is flush with the top surfaces of the chips 110-2. In some embodiments, the dielectric layer 130-2 may include epoxy resin, heat-resistant crystalline resin, polybenzoxazole, polyimide, phenylcyclobutene, polyphenylene sulfide, polyether ether ketone, polyether, a combination thereof, or the like. A method of forming the dielectric layer 130-2 may include a deposition process, a coating process or the like, and further include a planarization process.

Figure 2F:
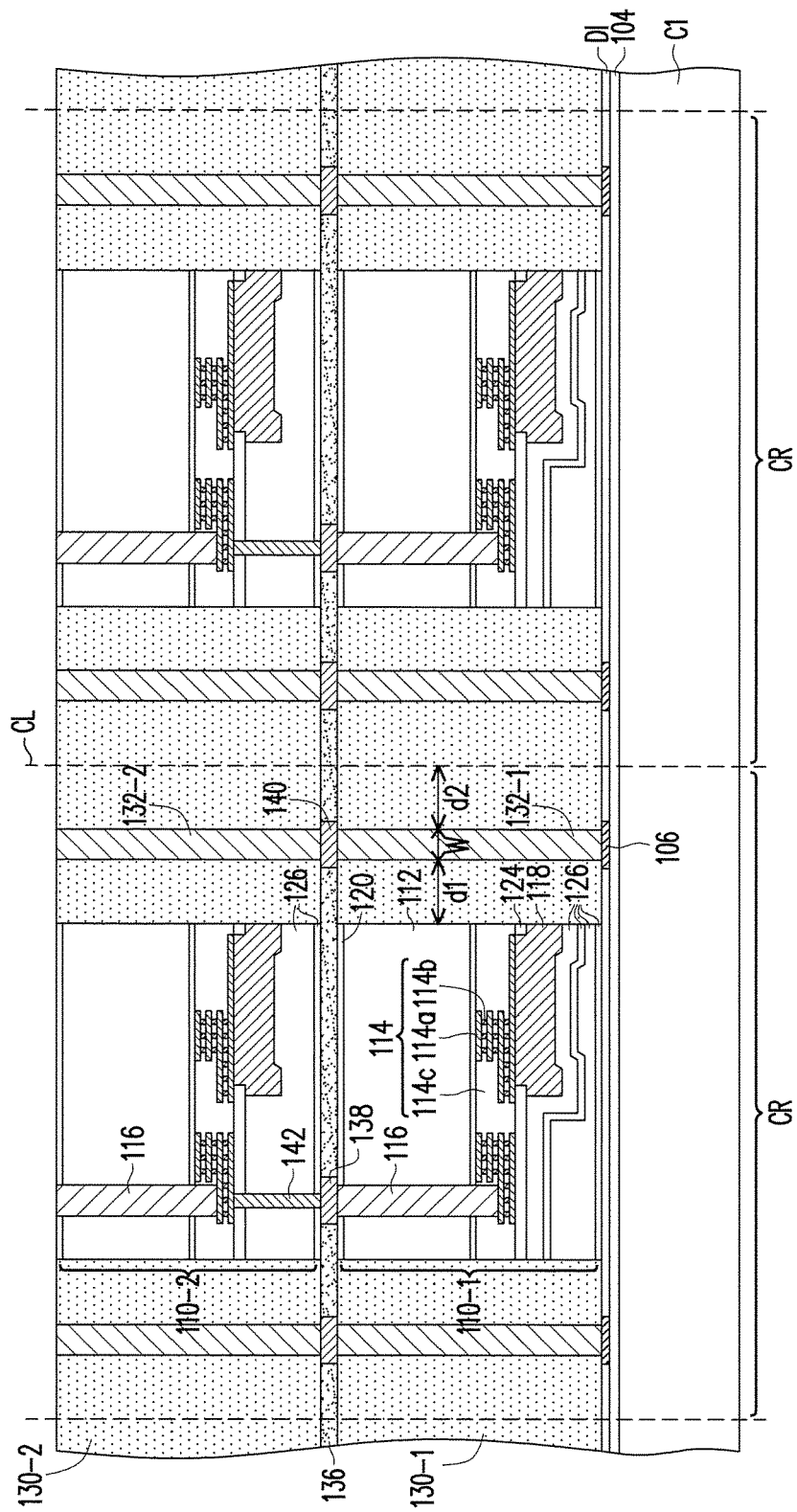

Referring to FIGS. 1 and 2F, in Step S60, a plurality of seal rings 132-2 is formed in the dielectric layer 130-2 to surround the chips 110-2 respectively. In some embodiments, the seal rings 132-2 are respectively formed between the cutting lines CL and the chips 110-2. In some embodiments, the seal rings 132-2 are disposed on the seal rings 132-1, and the seal rings 132-2 are overlapped with the seal ring 132-1 along the stacking direction of the chips 110-1, 110-2. In some embodiments, the seal rings 132-2 are aligned with the seal ring 132-1 along the stacking direction, for example. The seal rings 132-2 may penetrate from a surface to an opposite surface of the dielectric layer 130-2. For example, the seal rings 132-2 may be formed by forming openings in the dielectric layer 130-2 to expose the etch stop pattern 140 and filling materials in the openings. The materials of the seal rings 132-2 may be the same or different from the seal rings 132-1. In some embodiments, the materials of the seal rings 132-2 may be conductive materials such as copper, aluminum or alloys thereof. However, the disclosure is not limited thereto. In alternative embodiments, the materials of the seal rings 132-2 may be non-conductive materials. A method of forming the seal rings 132-2 includes a plating process, a deposition process, or the like. A width of the seal rings 132-2 is not smaller than 2 μm, a distance from the seal rings 132-2 to the adjacent chips 110-1 is not smaller than 10 μm, and a distance between the seal ring 132-2 to the adjacent cutting line CL is not smaller than 10 μm, for example. In some embodiments, the seal ring 132-2 may be a continuous and enclosed pattern, which corresponds to an outline of the chip 110-2. In some embodiments, the seal ring 132-2 is a hollow rectangular, a hollow circle (not shown) or the like. In alternative embodiments, the seal ring 132-2 may have a plurality of patterns arranged to form an open ring.

Figure 2G:
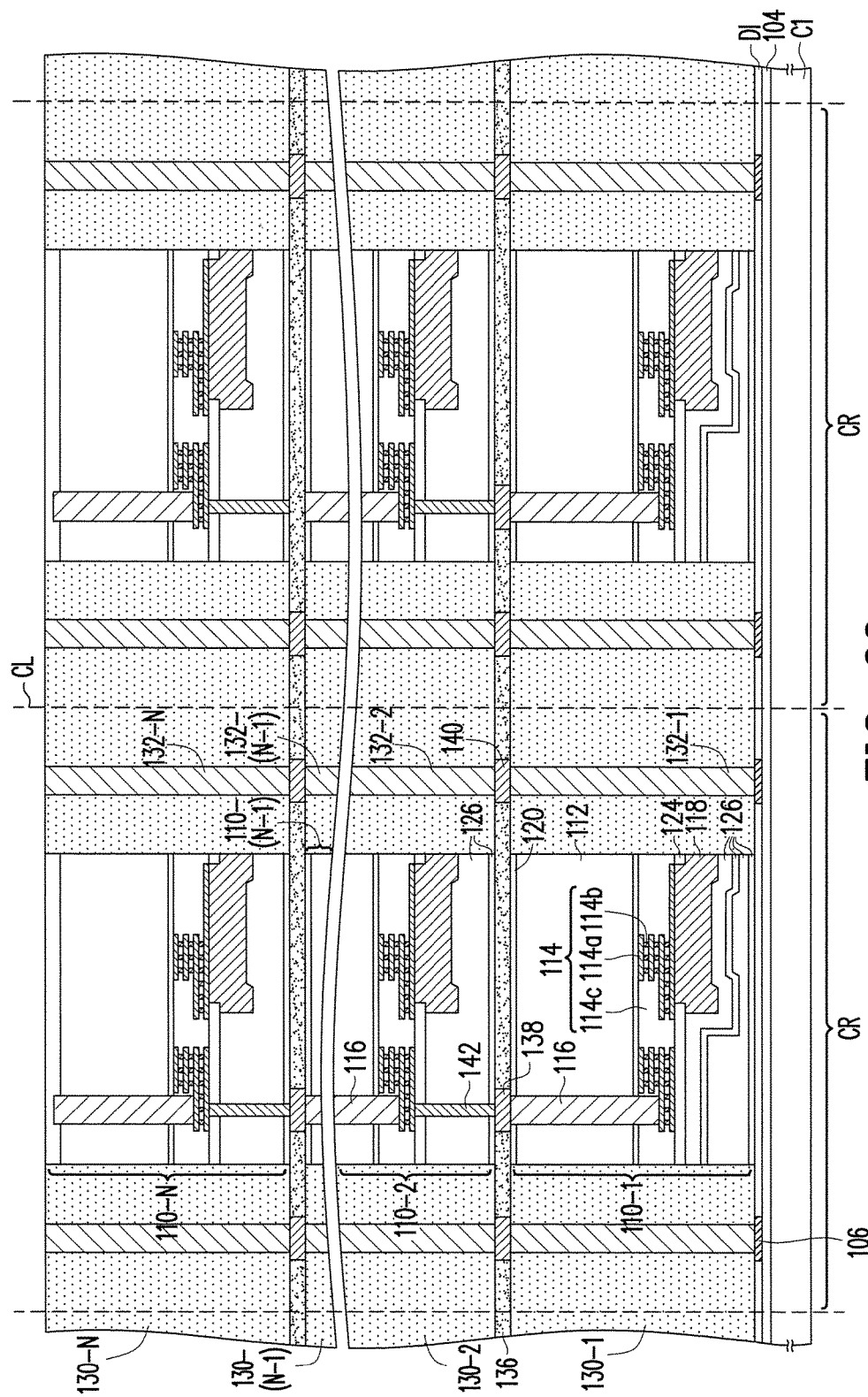

Referring to FIG. 2G, a plurality of topmost chips 110-N is stacked over chips 110-(N-1) respectively along the stacking direction, and a plurality of topmost seal rings 132-N is respectively formed in a dielectric layer 130-N to surround the chips 110-N. In some embodiments, the chips 110-(N-1) are stacked over the chips 110-2, 110-1 respectively along the stacking direction, and seal rings 132-(N-1) are respectively formed in a dielectric layer 130-(N-1) to surround the chips 110-(N-1). The chip 110-1 is the bottommost chip and the chip 110-N is the topmost chip in the chip stack, and N is the total number of the stacking chips and is a positive integer larger than 1. That is, the steps of placing the chips and forming the seal rings around the chips may be repeated several times (i.e., N times) until a desired number (i.e., N) of chips are stacked along the stacking direction. The structure of the chip 110-(N-1) is similar to the chip 110-2. In some embodiments, the structure of the topmost chip 110-N is similar to the chip 110-2 except that the isolation layer 120 covers the TSV 116, that is, the top surface of the TSV 116 is not exposed. In other words, after the topmost chips 110-N are bonded to the chips 110-(N-1), a thickness reduction process on the chips 110-N may be omitted. In some embodiments, the dielectric layer 136 may be formed between the stacking chips 110-(N-1), 110-N. In some embodiments, the connector 138 may be formed in the dielectric layer 136 to electrically connect the stacking chips 110-(N-1), 110-N. In addition, the etch stop pattern 140 may be formed in the dielectric layer 136 between the stacking seal rings 132-(N-1), 132-N. However, the disclosure is not limited thereto. In alternative embodiments, only two chips are stacked (i.e., N=2), which are the bottommost chip 110-1 and the topmost chip 110-N. The structure of the chip 110-(N-1) is similar to the chips 110-2.

Figure 2H:
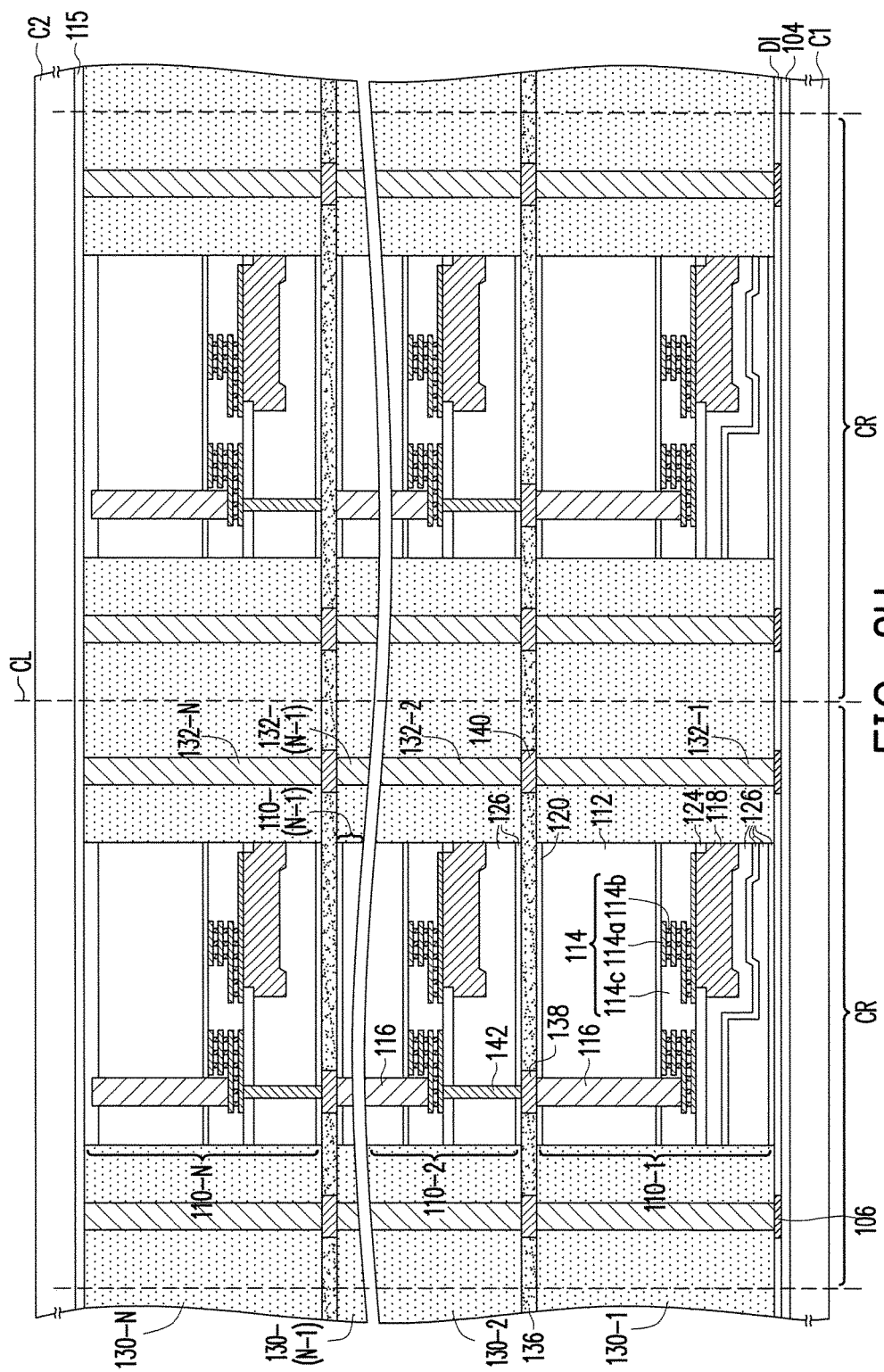

Referring to FIG. 2H, after a desired number of the chips 110-1 . . . 110-(N-1), 110-N are stacked, a carrier C2 is formed over the chips 110-1 . . . 110-(N-1), 110-N through a bonding layer 150, that is, the carrier C2 is disposed on the chips 110-N, the dielectric layer 130-N and the seal rings 132-N. In some embodiments, the carrier C2 is, for example, a wafer carrier.

Figure 2I:
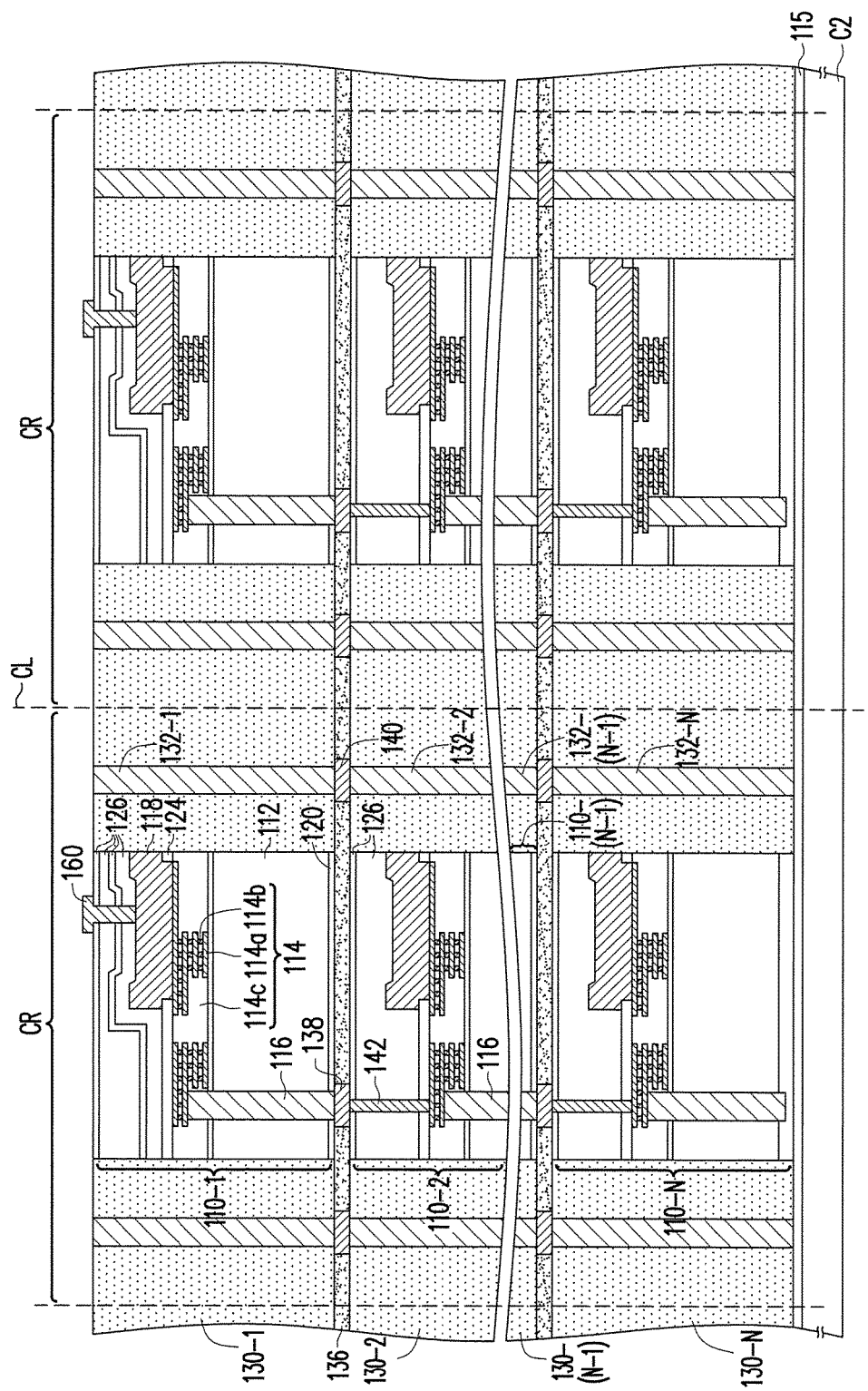

Referring to FIG. 2I, the structure of FIG. 2H is tuned over, and the carrier C1 is removed. Then, the dielectric layer DI is also removed. The carrier C1 may be debonded by applying laser irradiation, and the dielectric layer DI may be removed through an etching process or a cleaning process. After that, portions of the passivation layers 126 of the chips 110-1 are removed to expose the pads 118, and bumps 160 are formed in the passivation layers 126 to electrically connect to the pads 118. In some embodiments, the bumps 160 may be micro bumps, and the bumps 160 may protrude beyond the surfaces of the chips 110-1.

Figure 2J:
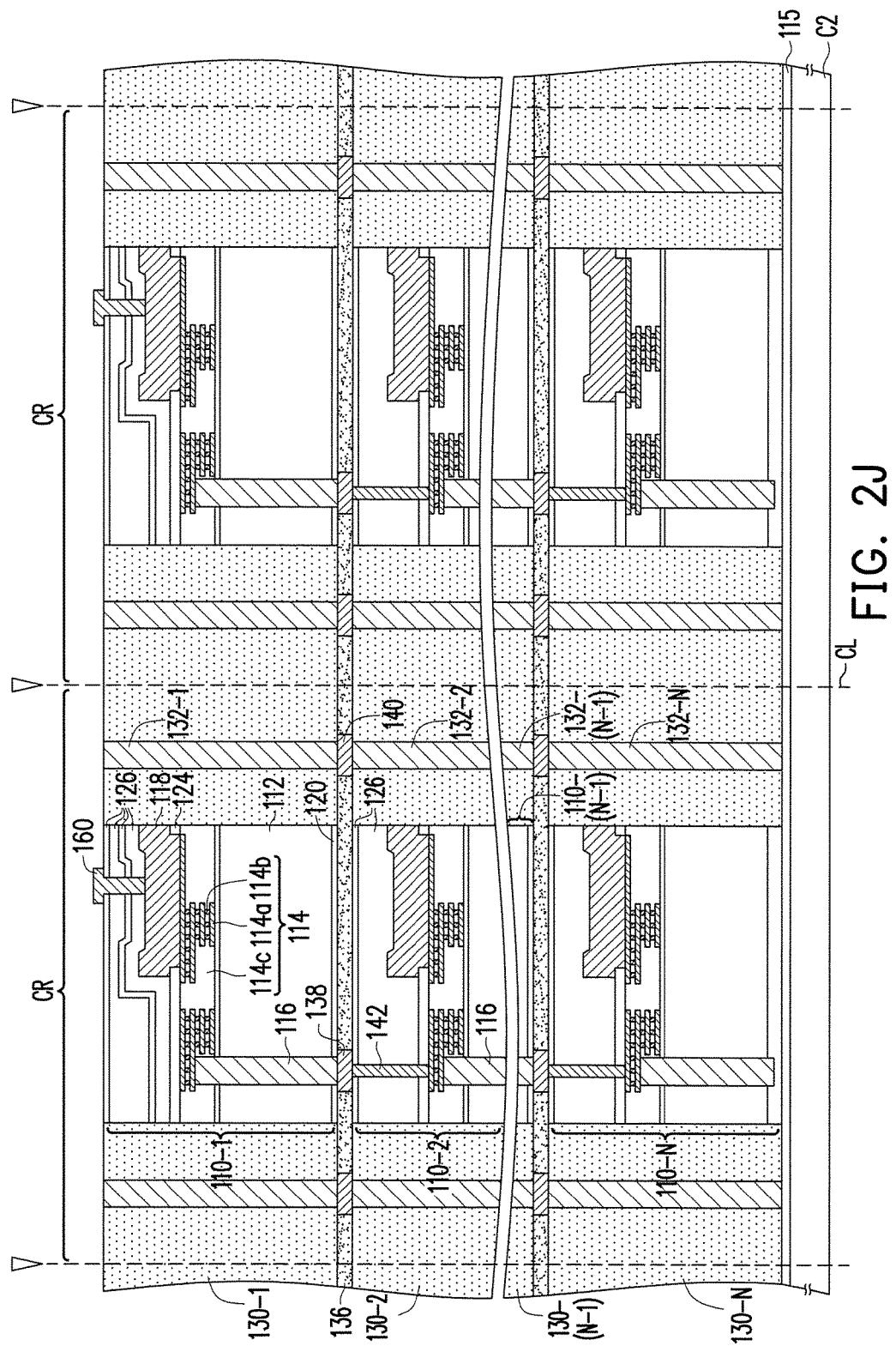
Figure 2K:
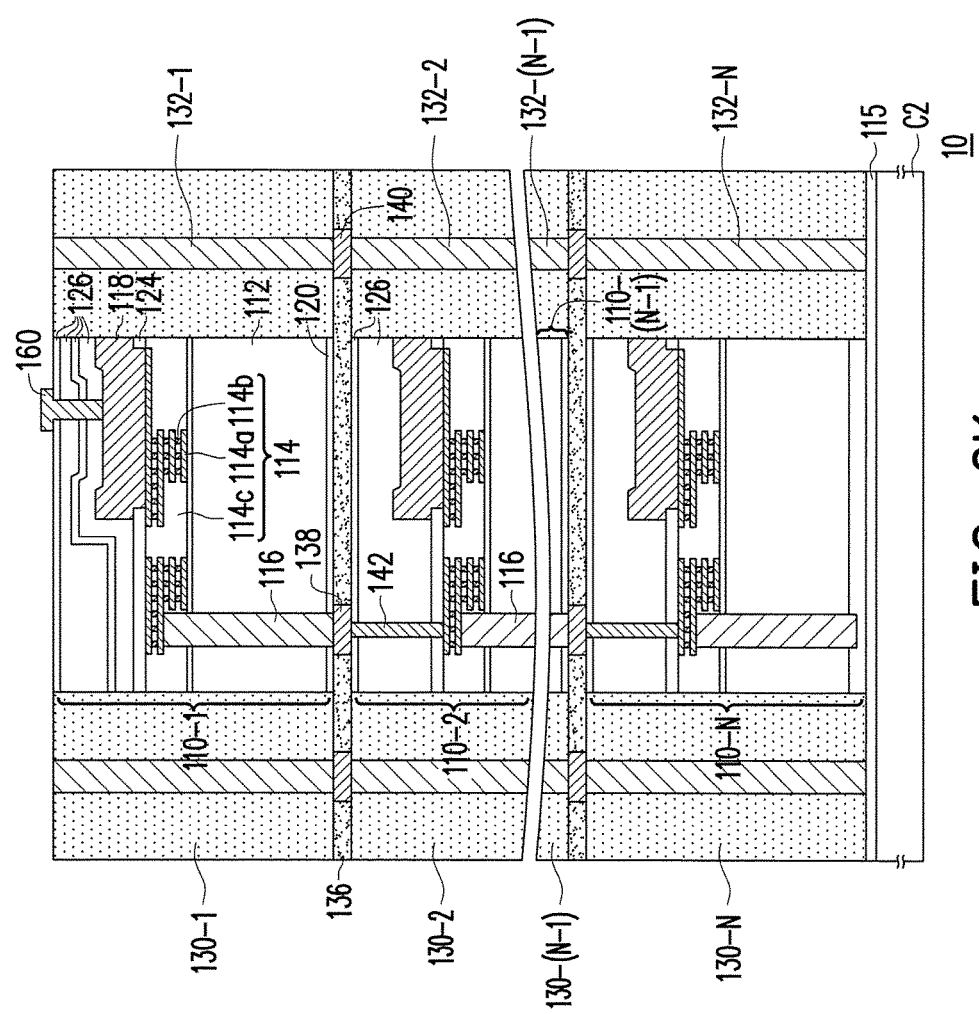

Referring to FIGS. 1 and 2J, in Step S70, a dicing process is performed along the cutting lines CL (the dotted line) to cut the whole package structure (at least cutting though the dielectric layers 130-1, 130-2, 130-(N-1), 130-N) into individual and separated semiconductor packages 10 each including the chips 110-1, 110-2, 110-(N-1), 110-N, as shown in FIG. 2K. Since the seal rings 132-1, 132-2, 132-(N-1), 132-N surround the chips 110-1, 110-2, 110-(N-1), 110-N and penetrate the dielectric layers 130-1, 130-2, 130-(N-1), 130-N, the seal rings 132-1, 132-2, 132-(N-1), 132-N provide protection and support during the dicing process, and the chips 110-1, 110-2, 110-(N-1), 110-N are prevented from cracking. In one embodiment, the dicing process is a wafer dicing process including mechanical blade sawing or laser cutting.

In some embodiments, the semiconductor package 10 includes the stacking chips 110-1, 110-2, 110-(N-1), 110-N, the dielectric layers 130-1, 130-2, 130-(N-1), 130-N encapsulating the chips 110-1, 110-2, 110-(N-1), 110-N, and the seal rings 132-1, 132-2, 132-(N-1), 132-N surrounding the chips 110-1, 110-2, 110-(N-1), 110-N. The semiconductor package 10 may be a SRAM cube, for example.

After the semiconductor package 10 is formed, the semiconductor package 10 may be stacked with other electronic devices. The electronic device may be, CPU, GPU, FPGA or an IC package, for example. The semiconductor package 10 is stacked over and electrically connected to the electronic device through the bump 160. In addition, terminal connectors such as C4 bumps may be formed on a surface of the electronic device opposite to the surface on which the semiconductor package 10 is stacked. In some embodiments, after stacked with other electronic devices, a thinning process may be formed on the carrier C2, or the carrier C2 may be removed.

In some embodiments, the seal ring is formed aside the chip to surround the chip, and penetrates the dielectric layer encapsulating the chip. Therefore, during the dicing process, the seal ring provides protection and support and the stacked chips are prevented from cracking, which may occur in the dielectric layer and/or passivation layers of the chip. In other words, the seal ring may reduce the effect on the cutting on the chips. Accordingly, the yield and the reliability of the package are increased.

In accordance with some embodiments of the present disclosure, a semiconductor package includes a plurality of chips and a plurality of seal rings. The chips are stacked upon and bonded to one another. The seal rings are respectively surrounding the plurality of chips.

In accordance with alternative embodiments of the present disclosure, a semiconductor package includes a first chip, a first dielectric layer, a first seal ring, a second chip, a second dielectric layer and a second seal ring. The first dielectric layer encapsulates the first chip. The first seal ring penetrates the first dielectric layer aside the first chip. The second chip is bonded to the first chip. The second dielectric layer encapsulates the second chip over the first dielectric layer. The second seal ring penetrates the second dielectric layer aside the second chip.

In accordance with yet alternative embodiments of the present disclosure, a method of forming a semiconductor package includes the following steps. A plurality of first chips is provided in a plurality of chip regions respectively, wherein the chip regions are defined by a plurality of cutting lines. A first dielectric layer encapsulates the plurality of first chips. A plurality of first seal rings is formed in the first dielectric layer to surround the plurality of first chips respectively. A plurality of second chips is stacked on the plurality of first chips respectively. A second dielectric layer is formed to encapsulate the plurality of second chips. A plurality of second seal rings is formed in the second dielectric layer to surround the plurality of second chips respectively. At least the first and second dielectric layer are cut along the cutting lines, so as to form a plurality of stacks each comprising the first and second chips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a plurality of chips stacked upon and bonded to one another; and
   a plurality of seal rings, respectively surrounding the plurality of chips, wherein top surfaces of one of the plurality of chips and one of the plurality of seal rings are coplanar and bottom surfaces of the one of the plurality of chips and the one of the plurality of seal rings are coplanar, and the one of the plurality of seal rings is integrally formed.

2. The semiconductor package of claim 1, wherein the plurality of seal rings are partially overlapped along a stacking direction of the plurality of chips.

3. The semiconductor package of claim 1, wherein the plurality of seal rings are aligned along a stacking direction of the plurality of chips.

4. The semiconductor package of claim 1, wherein at least one of the plurality of seal rings is a continuous pattern.

5. The semiconductor package of claim 1, wherein at least one of the plurality of seal rings comprises a plurality of patterns, and the patterns are separated and arranged to surround one of the plurality of chips.

6. The semiconductor package of claim 1, wherein at least one of the plurality of chips is surrounded by a first seal ring and a second seal ring of the plurality of seal rings, and the first seal ring is disposed between the second seal ring and the at least one of the plurality of chips.

7. The semiconductor package of claim 6, wherein the first seal ring includes a plurality of first patterns and the second seal ring includes a plurality of second patterns, and the first patterns and the second patterns are alternatively disposed.

8. A semiconductor package, comprising:
   a first chip, comprising a substrate;
   a first dielectric layer, encapsulating the substrate of the first chip;
   a first seal ring, penetrating the first dielectric layer aside the first chip;
   a second chip, bonded to the first chip;
   a second dielectric layer, encapsulating the second chip over the first dielectric layer; and
   a second seal ring, penetrating the second dielectric layer aside the second chip.

9. The semiconductor package of claim 8, wherein the first and second seal rings are partially overlapped along a stacking direction of the first and second chips.

10. The semiconductor package of claim 8, wherein the first and second seal rings are aligned along a stacking direction of the first and second chips.

11. The semiconductor package of claim 8 further comprising a third dielectric layer between the first and second chips and between the first and second dielectric layers.

12. The semiconductor package of claim 11 further comprising an etch stop pattern between the first and second seal rings.

13. The semiconductor package of claim 8, wherein the first and second seal rings respectively surround the first and second chips.

14. A method of forming a semiconductor package, comprising:

providing a plurality of first chips in a plurality of chip regions respectively, wherein the chip regions are defined by a plurality of cutting lines;

forming a first dielectric layer to encapsulate the plurality of first chips;

forming a plurality of first seal rings in the first dielectric layer to surround the plurality of first chips respectively;

stacking a plurality of second chips on the plurality of first chips respectively;

forming a second dielectric layer to encapsulate the plurality of second chips;

forming a plurality of second seal rings in the second dielectric layer to surround the plurality of second chips respectively; and cutting at least the first and second dielectric layer along the cutting lines, so as to form a plurality of stacks each comprising the first and second chips.

15. The method of claim 14 further comprising forming a third dielectric layer between the plurality of first chips and the plurality of second chips and between the first dielectric layer and the second dielectric layer.

16. The method of claim 15 further comprising forming etch stop patterns respectively between the first and second rings in the third dielectric layer.

17. The method of claim 14, wherein the plurality of first chips are provided on a first carrier, and the first carrier is removed before cutting along the cutting line.

18. The method of claim 17 further comprising forming a second carrier disposed opposite to the first carrier before removing the first carrier.

19. The method of claim 17, wherein the plurality of first seal rings are respectively formed on alignment marks on the first carrier.

20. The semiconductor package of claim 1, wherein the one of the plurality of seal rings is continuously extended in a single dielectric layer, a top of the single dielectric layer is coplanar with the top surfaces of the one of the plurality of chips and the one of the plurality of seal rings, and a bottom of the single dielectric layer is coplanar with the bottom surfaces of the one of the plurality of chips and the one of the plurality of seal rings.

* * * * *